(12) United States Patent
Kajava

(10) Patent No.: US 6,362,704 B1
(45) Date of Patent: Mar. 26, 2002

(54) CIRCUIT ARRANGEMENT IMPROVING THE CONTROL CHARACTERISTICS OF AN ATTENUATOR

(75) Inventor: Juha Kajava, Naantali (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/413,625

(22) Filed: Oct. 6, 1999

(30) Foreign Application Priority Data

Oct. 7, 1998 (FI) .................................................. 982178

(51) Int. Cl.⁷ .............................. H01P 1/22; H01P 1/10
(52) U.S. Cl. ..................................... 333/81 R; 333/103
(58) Field of Search .............................. 333/81 R, 109, 333/116, 81 A, 103

(56) References Cited

U.S. PATENT DOCUMENTS 4,843,354 A * 6/1989 Fuller et al. ............... 333/81 A
5,862,464 A * 1/1999 Omagari ..................... 455/280

FOREIGN PATENT DOCUMENTS

EP  0300524  1/1989

OTHER PUBLICATIONS

JP63220611, Variable Attenuator, Abstract, Yagi Antenna Co. Ltd, Inventor: Sato Yuzo Publication Date: Sep. 13, 1988.

JP60112306, Electronic Attenuator, Abstract, Kansai Nippon Denki KK, Inventor: Nishimura Takeshi, Publication Date: Jun. 18, 1985.

JP2156733, High Frequency Attenuator with Detector, Abstract, Kokusai Electric Co. Ltd. Inventor: Okubo Yoichi, Publication Date: Jun. 15, 1990.

JP10163785, Pi Attenuator for portable telephone, HF microwave charging apparatus includes linear rise circuit that consists of linear diode and resistance connected in parallel, Abstract Toshiba Lighting, Technol Corp., Inventor: Nogamida Wataru, Publication Date: Jun. 19, 1998.

* cited by examiner

*Primary Examiner*—Robert Pascal
*Assistant Examiner*—Kimberly E Glenn
(74) *Attorney, Agent, or Firm*—Ware, Fressola, Van Der Sluys & Adolphson, LLP

(57) ABSTRACT

A method is presented for biasing an attenuator circuit used in high frequency applications. The method can improve the stability of the AGC system, and in some cases also the control accuracy. An attenuator circuit is disclosed which comprises at least two attenuator members (23) connected in series. In connection with the attenuator members (23) in an attenuator circuit according to the invention there are connected a suitable number of biasing members (22) with which the biasing currents of the attenuator members (23) can be controlled to have different magnitudes, so that in an attenuation situation the attenuator members (23) begin to conduct separately, controlled by the AGC circuit.

8 Claims, 2 Drawing Sheets

CIRCUIT ARRANGEMENT IMPROVING THE CONTROL CHARACTERISTICS OF AN ATTENUATOR

TECHNICAL FIELD

The present invention is directed to an attenuator arrangement, particularly a PIN diode attenuator arrangement intended for the SHF frequency range, with which arrangement it is possible to improve the control characteristics of the attenuator.

BACKGROUND OF THE INVENTION

In the reception of phase modulated emissions, such as QPSK and QAM, the detector requires a signal which is amplified in linear stages and regulated to a suitable level. The emission level reaching the receiver can change during reception. An automatic gain control (AGC) system is required in order to have a constant signal level at the input of the detector. The control system includes a feedback, which compensates for the amplitude changes of the received emission by changing the gain of the receiver. Usually the control information about the gain is obtained as a voltage. Similarly, integrated circuits having an AGC function are generally voltage controlled. In the control system it is essential that the control loop is stable, and that the gain and phase margins are large enough to enable the compensation for component tolerances and any non-linearity.

At high frequencies a diode is one of the most common components used to control the signal level. Particularly a PIN diode is very suitable to be used in micro-wave circuits. It is used i.e. as a rectifier, a modulator, an attenuator, a switch, a phase shifter, and as a limiter. Here we examine the use of a PIN diode in attenuator applications.

A PIN diode attenuator can be controlled by regulating the direct current flowing through it. In a diode attenuator comprising PIN diodes the diodes can be connected in the signal path, either in series or in parallel. At high frequencies the maximum attenuation in a series connection is limited by the diode capacitance. Correspondingly, in a parallel connection the maximum attenuation is limited by the diode inductance, including the encapsulation. At high frequencies a parallel connection is restricted by, in addition to the inductance, the stray inductance of the capacitor required by the biasing connections. The capacitor can be dimensioned so that the dimensioning also observes the created stray inductance, whereby the capacitor can be brought into series resonance at the used frequency. This creates a so-called notch or trap circuit. However, when the frequency range is wide this method does not work, because the obtainable attenuation is strongly frequency dependent.

It is also possible to connect PIN diodes both in series and in parallel, whereby the obtainable maximum attenuation decreases rapidly when the frequency increases due to the above mentioned reasons. In wide band applications this is not desirable. An essentially more even frequency response than that of the previous configuration is obtained if there are used diodes connected in series and if the load impedance of every single diode is capacitive.

When a PIN diode acts as a series element the maximum attenuation depends on the diode capacitance in the reverse blocking state, and the minimum attenuation depends on the diode impedance at the highest current. The load impedance affects both the maximum and the minimum attenuation. Due to the diode capacitance at radio frequencies the attenuator's control range may be rather narrow, whereby it may be necessary to use an attenuator series connection containing several diodes in order to realise the required control range. FIG. 1 shows a prior art attenuator arrangement.

The attenuator arrangement presented in FIG. 1 comprises three series connected PIN diodes $D_1$, $D_2$, $D_3$. The diodes are biased with the biasing voltage $U_{BIAS}$ via the biasing circuit comprising a capacitor $C_B$ and a resistor $R_B$. The operation of the attenuator is controlled with the control voltage $U_{AGC}$ via the resistor $R_G$. The impedances $Z_1$, $Z_2$, $Z_3$ represent the load impedances of the diodes. The load impedances $Z_1$, $Z_2$ and $Z_3$ are not necessarily physical components, and therefore they are separated with a dotted line from the circuit shown in FIG. 1. It is also possible to add the impedances as physical components to the attenuator circuit, whereby a better voltage distribution between the diodes can be obtained. Mainly at high frequencies the impedances $Z_1$, $Z_2$ and $Z_3$ represent interferences such as stray capacitances and stray inductances generated in the components of the attenuator circuit. The capacitors $C_1$ and $C_2$ act as decoupling capacitors which decouple the DC voltage used for biasing purposes from the other circuits.

In a known way the current passing through a diode increases exponentially as a function of the voltage. The capacitance of the diode's equivalent circuit limits the attenuation range, whereby the voltage change over the diode terminals representing the useful attenuation range is quite small. As a result of this the diode voltage is close to the so-called threshold voltage. When several attenuators are connected in series, such as in the arrangement according to the FIG. 1, the same biasing current passes through all diodes $D_1$, $D_2$, $D_3$, whereby the voltage of all diodes is close to the threshold voltage. The resistance of the biasing resistor $R_B$ of the diode or diodes $D_1$, $D_2$, $D_3$ must be low in order to have a sufficient current for decreasing the minimum attenuation of the attenuator. When the resistance $R_B$ is low the control range of the control voltage $U_{AGC}$ corresponding to the attenuator's operation is limited to a small part of the total range of the control voltage. In practice this means that the change dG/dU of the attenuator's gain is not constant but depends strongly on the value of the voltage $U_{AGC}$. Due to this there is a tendency in the AGC system towards instability, which, depending on the level, changes among other things the settling time of the voltage $U_{AGC}$.

SUMMARY OF THE INVENTION

The object of this invention is to present a method for biasing a diode attenuator where the stability of the AGC system, and in some cases, also the control accuracy can be improved. A further object of the invention is to present an attenuator circuit where the biasing method according to the invention is applied.

The objects of the invention are attained by connecting biasing members in connection with the attenuator members, whereby a part of the biasing current can be supplied via the biasing members, whereby in an attenuation situation the attenuator members begin to conduct separately, controlled by the AGC circuit.

The biasing method according to the invention is characterized in that the biasing current of at least one attenuator member is controlled to have a different magnitude than the biasing current of at least one other attenuator member. The attenuator circuit according to the invention is characterized in that at least one biasing member is connected in connection with at least one attenuator member in order to control the biasing current of said attenuator member to have a different magnitude than the biasing current of at least one other attenuator member. Other advantageous embodiments of the invention are presented in the dependent claims.

The biasing arrangement according to the invention is substantially simpler than corresponding prior art solutions. With the solution according to the invention it is further possible to improve the control characteristics of an attenuator based on PIN diodes, because the arrangement according to the invention can improve the stability of the control system and decrease the change in the control steepness caused by the change in the control voltage $U_{AGC}$.

BRIEF DESCRIPTION OF THE DRAWINGS

The invention is described in detail below with reference to the enclosed figures, in which.

BEST MODE FOR CARRYING OUT THE INVENTION

Figure 2:
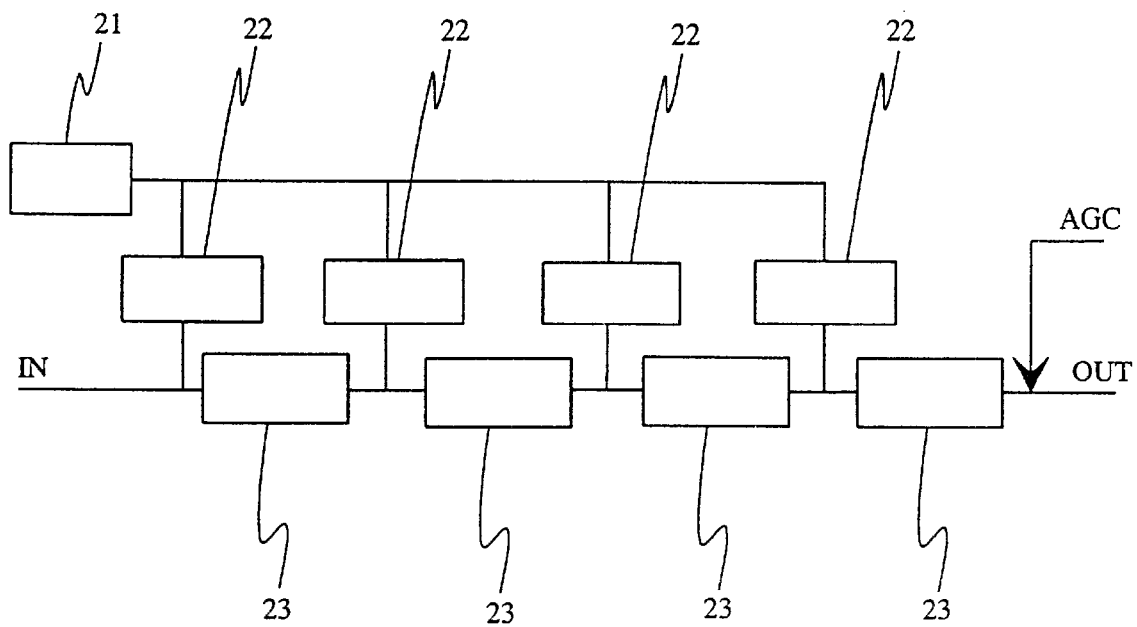
FIG. 2 shows a principle drawing of the invention.

FIG. 2 shows the basic arrangement of the invention. In this exemplary arrangement four attenuator members 23 are connected in series between the input IN and the output OUT. The attenuator members 23 can be for instance PIN diodes or any other components suitable for attenuation purposes in high frequency applications. The attenuation members 23 are set into the operating state with the aid of biasing members 22, through which the biasing current generated in the biasing circuit is supplied to the attenuator members 23. The biasing members 22 can be for instance resistors. The biasing member 22 of each attenuator member 23 is different from the others, so that the biasing can be separately realized for each attenuator member 23, whereby one attenuator member 23 at a time begins to conduct, controlled by the feedback loop AGC. For instance, if resistors act as the biasing members 22 and diodes act as the attenuator members 23, then the resistor values are dimensioned to be mutually different in such a way that the biasing currents through each diode are mutually different. Then the circuit's attenuation changes advantageously in one diode at a time.

Figure 3A:
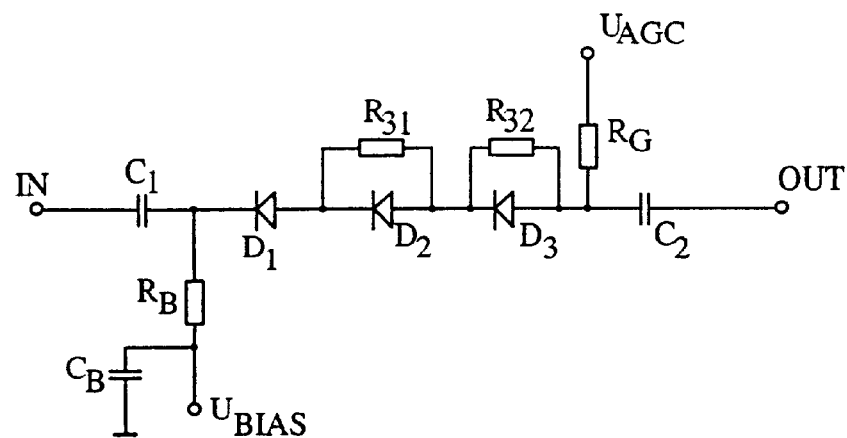
FIG. 3a shows a first attenuator arrangement according to the invention.

In FIG. 3a three attenuator members 23, which in this exemplary embodiment are PIN diodes $D_1$, $D_2$, $D_3$, are connected in series in the reverse direction between the input IN and the output OUT. At the first end of the series connection there is connected a first decoupling capacitor $C_1$ and at the other end of the series connection there is connected a second decoupling capacitor $C_2$. Between the second end of the first capacitor $C_1$ and the first end, the cathode, of the first PIN diode $D_1$ there is connected a biasing circuit 21, which in this exemplary embodiment comprises a by-pass capacitor $C_B$ and a biasing resistor $R_B$. In some cases the by-pass capacitor $C_B$ can be omitted. The attenuator circuit receives via the biasing circuit 21 a biasing current from the setting voltage $U_{BIAS}$, which is advantageously a DC voltage. In this exemplary embodiment a resistor $R_{31}$ is connected in parallel with the second attenuator diode $D_2$, and a resistor $R_{32}$ is connected in parallel with the third attenuator diode $D_3$. Between the second end of the third attenuator diode $D_3$, the anode, and the first end of the second capacitor $C_2$ there is connected as a feedback the feedback voltage $U_{AGC}$, which is supplied to the attenuator circuit through the resistor $R_G$. The feedback can be taken for instance at the output of a detector used in high frequency applications. To a person skilled in the art it is obvious that, even if there is connected no resistor in parallel with the first attenuator diode $D_1$, it is possible to do so without changing the inventive idea presented here.

Figure 3B:
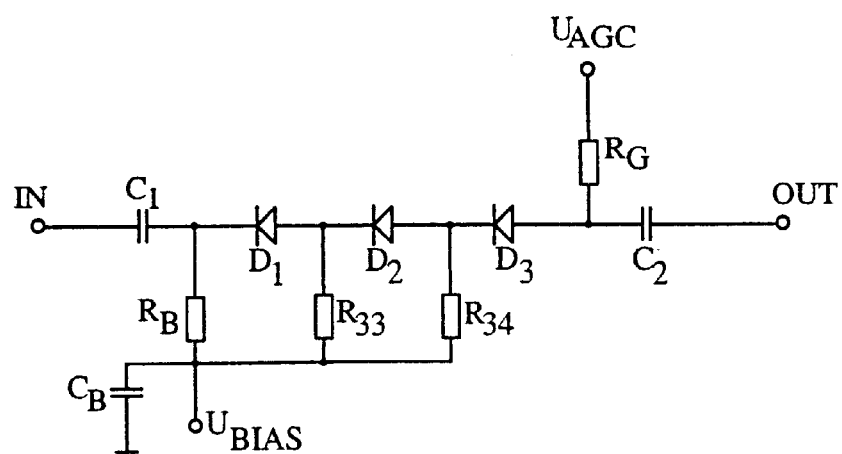
FIG. 3b shows a second attenuator arrangement according to the invention.

FIG. 3b shows another exemplary attenuator arrangement. The attenuator arrangement comprises three PIN diodes $D_1$, $D_2$, $D_3$, which are arranged in series in the same way as presented above. The attenuator arrangement of FIG. 3b comprises a biasing circuit, which comprises a biasing capacitor $C_B$ and a biasing resistor $R_B$. The biasing resistor $R_B$ is connected at its first end to the biasing voltage $U_{BIAS}$ and at the other end to a point between the first end of the first PIN diode $D_1$ and the decoupling capacitor $C_1$. A decoupling capacitor $C_2$ is connected to the second end of the third attenuator diode $D_3$, and the feedback voltage $U_{AGC}$ is connected via a resistor $R_G$ to a point between the diode $D_3$ and the capacitor $C_2$. In the attenuator arrangement shown in FIG. 3b at the connection point between the second end of the first attenuator diode $D_1$ and the first end of the second attenuator diode $D_2$ there is connected a resistor $R_{33}$, which at its second end is connected to a constant voltage, or in this exemplary embodiment to the biasing voltage $U_{BIAS}$. At the connection point between the second end of the second attenuator diode $D_2$ and the first end of the third attenuator diode $D_3$ there is also connected a resistor $R_{34}$, which at its second end is connected to the constant voltage $U_{BIAS}$.

The number of attenuator diodes $D_1$, $D_2$, $D_3$ is in no way restricted to three, but it is possible to use a suitable number of attenuator members 23 according to each application. To a person skilled in the art it is obvious that the number of biasing members 22 connected to the attenuator members 23, in this exemplary embodiment the number of the resistors $R_{31}$, $R_{32}$, $R_{33}$, $R_{34}$ is related to the number of attenuator members 23. In the arrangement according to FIG. 3a the resistances of the resistors $R_{31}$ and $R_{32}$ can be dimensioned to have a different size within the inventive idea, so that there is a different current passing through each attenuator diode $D_1$, $D_2$, $D_3$. To a person skilled in the art it is obvious that in the arrangement according to figure 3b the resistances of the resistors $R_{33}$ and $R_{34}$ must not necessarily be different. One attenuator member 23, preferably the first one, can be left without a biasing member 22. Most preferably all biasing currents are of a different magnitude, but to a person skilled in the art it is obvious that at least one biasing current has a different magnitude compared to at least one other biasing current.

Figure 1:
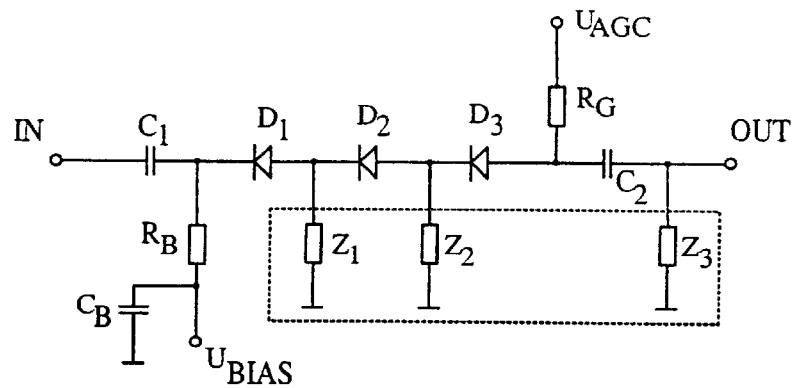
FIG. 1 shows a prior art attenuator arrangement.

To a person skilled in the art it is obvious that in the arrangement shown in FIGS. 3a and 3b the impedances $Z_1$, $Z_2$ and $Z_3$ according to FIG. 1 have been omitted, whereby these impedances preferably represent the stray capacitances and stray inductances generated in the members belonging to the arrangement. In one embodiment of the invention it is possible to add to the circuit a required number of suitably dimensioned impedances which can improve the voltage distribution between the diodes. As impedances it is possible to use for instance suitably chosen capacitors in a number required by each application.

When the resistors are dimensioned there is observed at least the number of the attenuator members 23 and their characteristics, such as the capacitance in the reverse blocking state. A first dimensioning method of the resistors is that the resistance of the smallest resistor is dimensioned so that the maximum achievable attenuation decreases by a certain amount acceptable in the particular case, for instance 1 dB. When the characteristics of the diode are taken into account the value of the next resistor is always many times larger than that of the previous one. Another way to dimension is that the lowest resistance value is dimensioned so that the minimum achievable attenuation increases by an acceptable amount, for instance 1 dB. When the characteristics of the diodes are taken into account the value of the next resistor is many times that of the previous one. It is also possible to dimension the resistors in other ways than those presented as examples here.

Below we examine the function of the circuits presented above. A radio frequency signal, for instance a signal belonging to the SHF (Super High Frequencies) range, is supplied to the input IN of the circuit shown in FIG. 3a. The PIN diodes $D_1$, $D_2$, $D_3$ are biased through the biasing circuit, which supplies a DC voltage to the circuit. The first PIN diode $D_1$ passes through the whole biasing current. The second PIN diode $D_2$ passes through only a part of the current, and a part of it is directed via the resistor $R_{31}$. The third PIN diode $D_3$ passes again a part of the original biasing current, and a part of it is directed via the resistor $R_{32}$. Here it must be observed that all attenuator diodes are passed by currents with different magnitudes, because the resistance values of the parallel resistors are mutually different. The attenuation of the circuit depends on how large a voltage difference there is between the ends of the attenuator members 23. The higher the current which passes through an attenuator member 23 the lower is the attenuation, because the high frequency resistance of the attenuator member 23 is then at its minimum. The capacitors $C_1$ and $C_2$ prevent any DC voltage, such as the biasing voltage in the attenuator circuit from reaching any circuits after the attenuator circuit. The capacitors $C_1$ and $C_2$ will pass any radio frequency signal supplied to the input IN as an attenuated signal to the circuits after the attenuator circuit. The circuit shown in FIG. 3b operates in a corresponding way.

The result of the biasing method presented above is that when the attenuation is decreased, controlled by the feedback voltage $U_{AGC}$, one attenuator diode $D_1$, $D_2$, $D_3$ at a time will start to conduct. Only when the high frequency resistance of the first conducting diode has decreased substantially does the current of the next diode in the chain increase, and correspondingly its resistance to decrease. This arrangement provides an advantage in that the attenuation is changed generally in one diode at a time, when the attenuation of the other diodes is close to the maximum or minimum. In this way the gain change dG/dU decreases, and it does not change as strongly as in a circuit which does not contain the described biasing arrangement.

To a person skilled in the art it is obvious that different embodiments of the invention are not limited to the above-presented examples, but that they can vary within the inventive idea defined by the enclosed claims. To a person skilled in the art it is further obvious that the components in the above-presented examples are not restricted in any way, but that the solution according to the invention can be realized by all components suitable for the inventive use. The number of the attenuator members 23, and thus also the number of the biasing members 22, is neither limited in any way, but their number depends on the requirements of the attenuator application.

What is claimed is:

1. A method for controllably biasing an attenuator circuit having an input and an output, comprising at least two attenuator members (23) connected in series between said input and said output, characterized in that the biasing current of at least one of said at least two attenuator members (23) is controlled to have a different magnitude than the biasing current of at least one other of said at least two attenuator members (23) so as to provide variable attenuation of a signal applied to the input of the attenuator circuit when said signal exits said output.

2. A method according to claim 1, characterized in that the biasing current of each attenuator member (23) is controlled to have a different magnitude than the other attenuator members (23).

3. A method according to claim 1, characterized in that the biasing current is controlled by passing the current past the attenuator member (23) with the aid of a biasing member (22).

4. An attenuator circuit comprising an input and an output, at least two biasing members (22), and at least two attenuator members (23) connected in series between said input and said output, characterized in that at least one biasing member (22) is connected in connection with at least one of said at least two attenuator members (23) in order to control the biasing current of said attenuator member (23) to have a different magnitude than the biasing current of at least one other of said at least two attenuator members (23) so as to provide variable attenuation of a signal applied to the input of the attenuator circuit when said signal exits said output.

5. An attenuator circuit according to claim 4, characterized in that the biasing member (22) is at least a resistive member.

6. An attenuator circuit according to claim 4, characterized in that the attenuator member (23) is a PIN diode.

7. An attenuator circuit according to claim 4, characterized in that at least one biasing member (22) is connected in parallel with the attenuator member (23).

8. An attenuator circuit according to claim 4, characterized in that for more than one attenuator member (23) there is connected at least one biasing member (22) between at least one end of the attenuator member (23) and the input of the control voltage ($U_{BIAS}$) of the biasing current.

* * * * *